United States Patent
Kaminski et al.

(10) Patent No.: US 9,341,665 B2
(45) Date of Patent: May 17, 2016

(54) METHOD AND APPARATUS FOR HIGH VOLTAGE ISOLATION MONITOR FOR A VEHICLE

(75) Inventors: George Kaminski, Livonia, MI (US); Richard J. Hampo, Plymouth, MI (US)

(73) Assignee: Lear Corporation, Southfield, MI (US)

(*) Notice: Subject to any disclaimer, the term of this patent is extended or adjusted under 35 U.S.C. 154(b) by 518 days.

(21) Appl. No.: 13/449,665

(22) Filed: Apr. 18, 2012

(65) Prior Publication Data

US 2013/0278272 A1    Oct. 24, 2013

(51) Int. Cl.
| | |
|---|---|
| *G01R 27/18* | (2006.01) |
| *G01R 31/14* | (2006.01) |
| *G01R 31/02* | (2006.01) |
| *B60L 3/00* | (2006.01) |
| *B60L 3/04* | (2006.01) |
| *G01R 31/00* | (2006.01) |

(52) U.S. Cl.
CPC .............. *G01R 31/025* (2013.01); *B60L 3/0069* (2013.01); *B60L 3/04* (2013.01); *G01R 27/18* (2013.01); *G01R 31/006* (2013.01); *G01R 31/14* (2013.01)

(58) Field of Classification Search
CPC ........ G01R 31/08; G01R 31/14; G01R 31/28; G01R 27/18; G01R 31/006; G01R 31/025; G07C 5/00; G07C 5/0816; B60R 16/0232
USPC ................. 324/500–513, 523, 525, 522, 551, 324/691–713; 702/91, 93; 361/42; 701/31.4, 34.4, 36, 102, 22, 29.6, 33.9, 701/29.1
See application file for complete search history.

(56) References Cited

U.S. PATENT DOCUMENTS

| | | | |
|---|---|---|---|
| 5,666,040 A | 9/1997 | Bourbeau | |
| 7,049,825 B2 * | 5/2006 | Carruthers | .................... 324/509 |
| 7,379,833 B2 * | 5/2008 | Kamishima | .................... 702/104 |
| 7,565,253 B2 | 7/2009 | Ewers et al. | |

(Continued)

FOREIGN PATENT DOCUMENTS

| | | |
|---|---|---|
| CN | 2565028 Y | 8/2003 |
| CN | 101158701 A | 4/2008 |

(Continued)

OTHER PUBLICATIONS

Chinese Office Action for corresponding Application No. 201310112084.3, mailed Mar. 17, 2015, 12 pages.

*Primary Examiner* — Tung X Nguyen
*Assistant Examiner* — Neel Shah
(74) *Attorney, Agent, or Firm* — Brooks Kushman P.C.

(57) ABSTRACT

An apparatus for monitoring a high voltage isolation in a vehicle. The apparatus comprising a power conversion device for receiving a high voltage on a power bus. The power conversion device is configured to control a first switch for enabling a first known resistance to receive the high voltage and to measure a first voltage between a first node and a ground in response to the first known resistance receiving the high voltage. The power conversion device is further configured to measure a second voltage between a second node and the ground in response to the first known resistance receiving the high voltage and to determine a first leakage resistance between the first node and the ground based on at least the first voltage and the second voltage. The first leakage resistance indicating whether the high voltage is isolated from the ground.

15 Claims, 3 Drawing Sheets

(56) References Cited

U.S. PATENT DOCUMENTS

| | | | |
|---|---|---|---|
| 7,924,019 B2 | 4/2011 | Trenchs Magana et al. | |
| 8,040,139 B2* | 10/2011 | Plagens et al. | 324/509 |
| 8,168,315 B1* | 5/2012 | Hermann | 429/92 |
| 8,575,940 B2* | 11/2013 | Yugou et al. | 324/427 |
| 2001/0052778 A1 | 12/2001 | Smith | |
| 2001/0054902 A1 | 12/2001 | Smith et al. | |
| 2006/0136163 A1 | 6/2006 | Kamishima | |
| 2007/0132457 A1* | 6/2007 | Okamoto et al. | 324/522 |
| 2009/0314073 A1* | 12/2009 | Perryman et al. | 73/114.45 |
| 2009/0323233 A1* | 12/2009 | Shoemaker et al. | 361/42 |
| 2011/0006777 A1* | 1/2011 | Park et al. | 324/509 |
| 2011/0013327 A1 | 1/2011 | Hyde et al. | |
| 2011/0025247 A1 | 2/2011 | Savagian et al. | |
| 2011/0101989 A1 | 5/2011 | Hyde et al. | |
| 2011/0307196 A1* | 12/2011 | Schumacher | 702/58 |
| 2012/0314327 A1* | 12/2012 | Liu et al. | 361/56 |

FOREIGN PATENT DOCUMENTS

| | | |
|---|---|---|
| CN | 101261301 A | 9/2008 |
| CN | 101846711 A | 9/2010 |
| CN | 201886083 U | 6/2011 |
| CN | 201965190 U | 9/2011 |

* cited by examiner

METHOD AND APPARATUS FOR HIGH VOLTAGE ISOLATION MONITOR FOR A VEHICLE

TECHNICAL FIELD

Embodiments set forth herein generally relate to a method and apparatus for a high voltage isolation monitor for a vehicle that is also capable of withstanding hi-pot testing.

BACKGROUND

It is known to provide a mechanism for detecting the presence of a fault for a vehicle which utilizes high voltage components and subsystems. One example for detecting of a fault is set forth below.

U.S. Pat. No. 7,924,019 to Trenchs et al. provides an inverter system for a vehicle comprising a housing, a primary stage, a secondary stage, and a fault detection circuit. The primary stage is configured to receive a first signal from an energy power source to generate a second voltage signal. The secondary stage is configured to generate a third voltage signal in response to the second voltage signal. At least one of the primary and the secondary stages define at least one resistance point for discharging leakage current responsive to generating the third voltage signal. The fault detection circuit is configured to electrically couple the primary stage and the secondary stage to provide the second voltage signal to the secondary stage to measure a portion of the third voltage signal to determine whether the leakage current being discharged through the at least one resistance point is within a predetermined current range.

It is expected that some mechanisms utilized in the vehicle high voltage isolation monitoring are also arranged to withstand a large amount of voltage that is applied to the same when performing hi-pot testing.

SUMMARY

An apparatus for monitoring a high voltage isolation in a vehicle. The apparatus comprising a power conversion device for receiving a high voltage on a power bus. The power bus includes a first node and a second node. The power conversion device is configured to control a first switch for enabling a first known resistance to receive the high voltage and to measure a first voltage between the first node and a ground in response to the first known resistance receiving the high voltage. The power conversion device is further configured to measure a second voltage between the second node and the ground in response to the first known resistance receiving the high voltage and to determine a first leakage resistance between the first node and the ground based on at least the first voltage and the second voltage. The first leakage resistance being indicative of whether the high voltage is isolated from the ground.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompany drawings in which:

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The embodiments of the present disclosure generally provide for a plurality of circuits or other electrical devices. All references to the circuits and other electrical devices and the functionality provided by each, are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical implementation that is desired. It is recognized that any circuit or other electrical device disclosed herein may include any number of microprocessors, integrated circuits, memory devices (e.g., FLASH, RAM, ROM, EPROM, EEPROM, or other suitable variants thereof) and software which co-act with one another to perform operation(s) disclosed herein.

Figure 1:
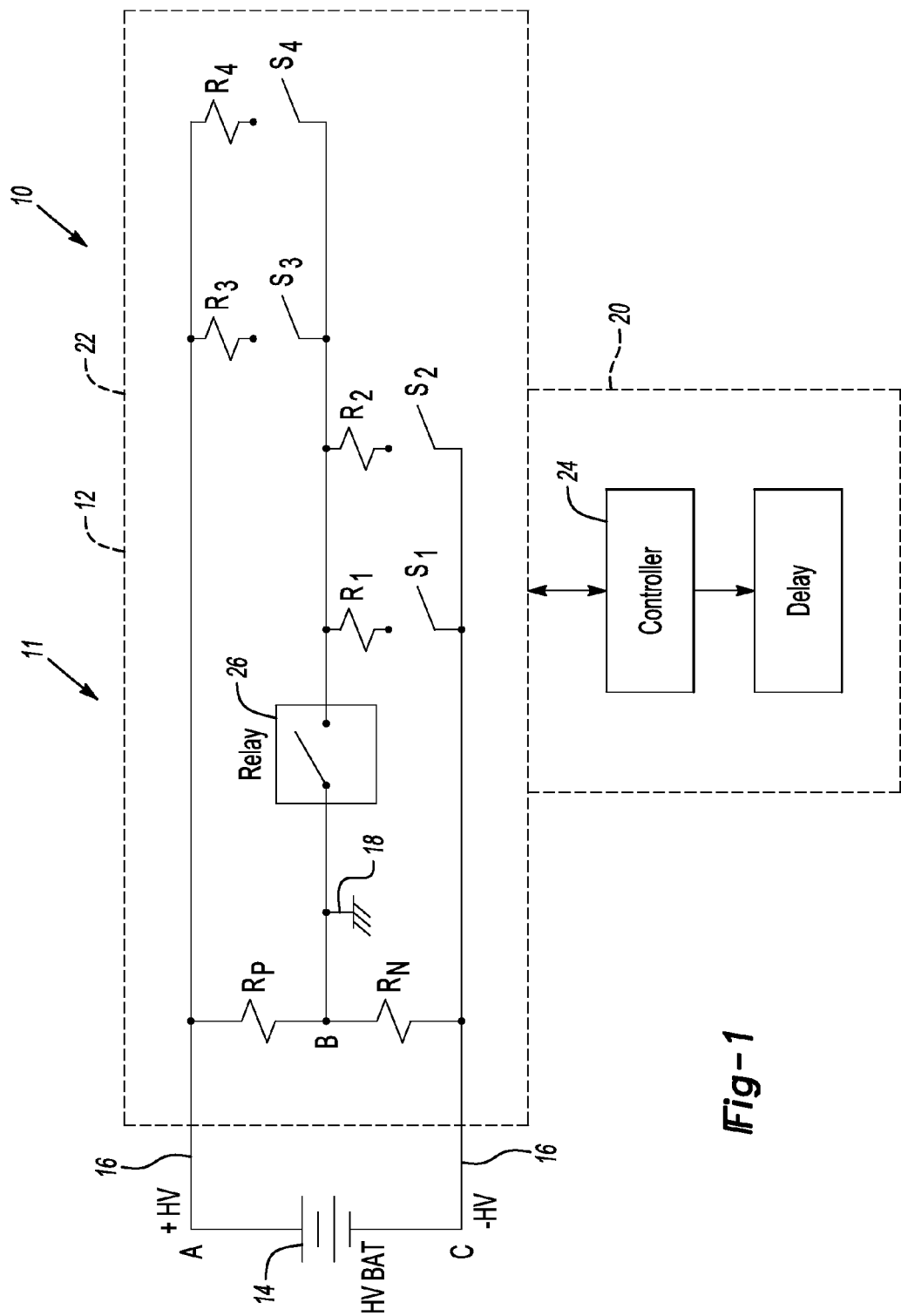
FIG. 1 depicts an apparatus for high voltage isolation monitor for a vehicle in accordance to one embodiment of the present invention.

FIG. 1 depicts an apparatus 10 for performing a high voltage isolation monitor for a vehicle system 11. The apparatus 10 includes a power conversion device 12 for converting hi-energy from one form into another. For example, the power conversion device 12 may be implemented as a converter such as a DC/DC converter that converts high DC voltage into a low DC energy (or vice versa), an inverter that converts high DC voltage into AC voltage, or other suitable device.

A power source 14 generally provides the high voltage to the power conversion device 12. In one example, the power source 14 (or power storage device) may provide a high DC based voltage to the power conversion device 12. The power conversion device 12 (i.e., if implemented as an inverter) may covert the high DC based voltage into an AC output for powering an electric motor (not shown) in the vehicle. Such an implementation may be prevalent, for example, in a hybrid or electric vehicle. It is recognized that the high DC voltage may exceed 400V. A high voltage bus 16 (e.g., +HV and −HV) electrically couples the power source 14 to the power conversion device 12 and provides the high DC based voltage to the power conversion device 14. A chassis ground 18 is electrically connected to the power conversion device 12 and to the high voltage bus 16 for grounding the power conversion device 12 while receiving the high DC voltage. The chassis ground 18 establishes a ground to earth. For example, the chassis ground 18 is coupled to a conductive element and to earth via wheels of the vehicle.

The power conversion device 12 is generally configured to measure (or determine) an impedance (or leakage resistance) (e.g., as represented by resistances Rp and Rn) between the high voltage bus 16 and the chassis ground 18 to determine if the measured impedance is within a sufficient safety isolation range while the power conversion device 12 receives the high DC voltage. A low impedance measurement may be indicative of a fault (or failure) in the vehicle system 11 in which it may be necessary to stop receiving the high DC energy. For example, a low impedance measurement between the high voltage bus 16 and the chassis ground 18 may indicate that the high DC voltage is not properly isolated from the chassis ground 18. While the resistances Rp and Rn as well as the chassis ground 18 are shown in the power conversion device 12, such resistances are illustrative and may be present anywhere along the electrical connection between the power source 14 and the power conversion device 12.

The power conversion device 12 generally includes a first portion 20 and a second portion 22. The first portion 20 includes a controller 24 that is configured to control various devices within the second portion 22. For example, the second portion 22 includes a relay 26, a plurality of resistors R1, R2, R3, and R4 and a plurality of switches S1, S2, S3, and S4. The controller 24 is configured to selectively open/close the various switches S1, S2, S3, and S4 to measure the impedance (Rp and Rn) between the high voltage bus 16 and the chassis ground 18 in order to determine if the impedance is within a safe isolation range. For example, the controller 24 transmits a control signal to each switch S1, S2, S3, and S4 to ascertain the impedance measurements while the vehicle is operating in a normal mode (i.e., driver is driving vehicle) and during an on-demand self-test in a diagnostic mode, or periodically while the vehicle is asleep. This aspect will be discussed in more detail in connection with FIG. 3.

It is recognized that the resistors R1, R2, R3, and R4 may each correspond to any number of resistors that are in series with one another or in parallel with one another. Likewise, the resistors may be grouped into any combination of series and/or parallel configurations. The power conversion device 12 may be required to undergo hi-pot testing which serves to electrically over-stress the same. In addition, the purpose of the hi-pot test is to ensure that the power conversion device 12 is properly isolated between the chassis ground 18 and other nodes. While performing such a test, the power conversion device 12 may receive a voltage that well exceeds the amount normally provided by the power source 14. Generally, this test is performed prior to the installation of the power conversion device 12 in the vehicle. Normally, in most cases, various electronics within a device are rated higher to withstand higher amounts of voltage that is applied during the hi-pot test. The power conversion device 12 utilizes various electronics (e.g., the plurality of resistors R1, R2, R3, and R4 and the plurality of switches S1, S2, S3, and S4) that are rated to handle lower voltage levels while the vehicle is in a normal operating mode and are not rated to the amount needed while the hi-pot test is performed. Such a condition may reduce cost and overall complexity of the implementation. The relay 26 is the device that is rated to handle the hi-pot voltage test.

To enable the power conversion device 24 to implement lower rated electronics (e.g., the plurality of resistors R1, R2, R3, and R4 and the plurality of switches S1, S2, S3, and S4) while the hi-pot test is performed, the relay 26 is provided in a normally open state, thereby preventing the high voltage from passing to the plurality of resistors R1, R2, R3, and R4 and the plurality of switches S1, S2, S3, and S4. Upon the power conversion device 12 being powered in the vehicle system 11, the relay 26 closes thereby allowing the switches (S1, S2, S3, and S4) and the resistors (R1, R2, R3, and R4) to receive the high voltage from the power source 14. The power conversion device 12 is not powered during hi-pot testing as the one purpose of such testing is to ensure that the device 12 has proper isolation between the chassis ground 18 and other nodes. The relay 26 may be in a normally open state when the power conversion device 12 is not powered.

Figure 2:
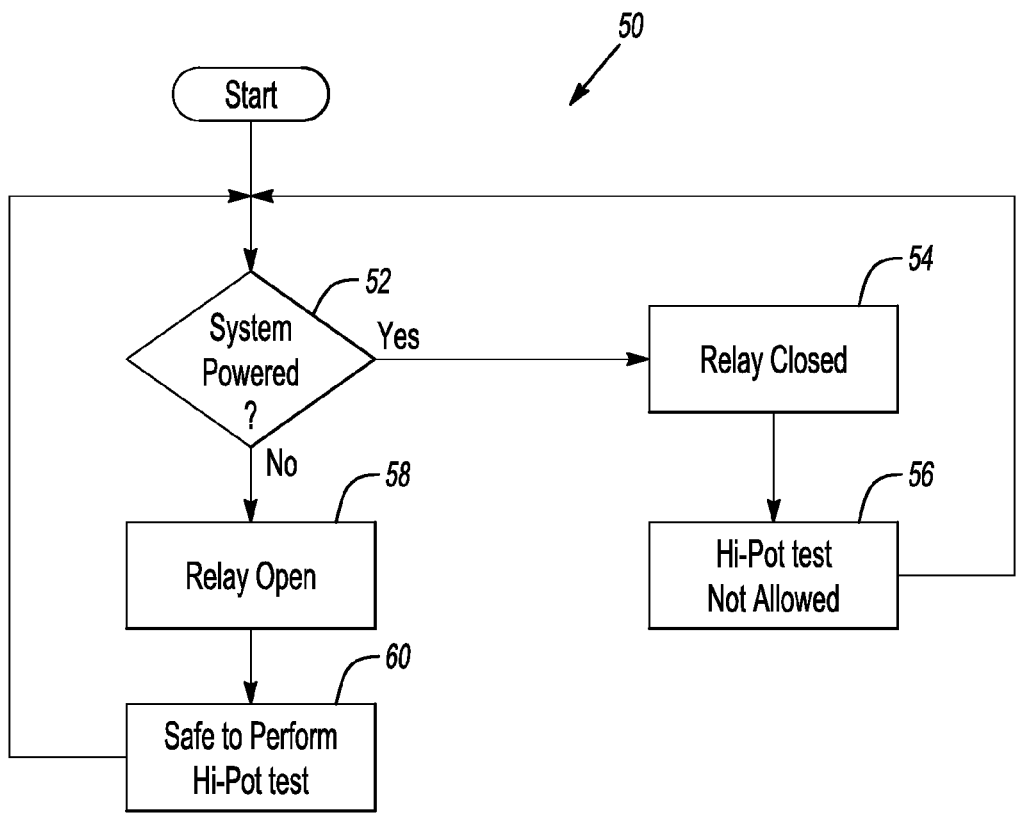
FIG. 2 depicts a method for performing hi-pot testing for the apparatus in accordance to one embodiment of the present invention.

FIG. 2 depicts a method 50 for performing a hi-pot test for the power conversion device 12 in accordance to one embodiment of the present invention.

In operation 52, a check is performed to determine if the power conversion device 12 is powered. The power conversion device 12 may be powered to perform the operation of converting power. If the power conversion device 12 is powered, then the method 50 moves to operation 54. If not, then the method 50 moves to operation 58.

In operation 54, the controller 24 transmits a control signal to the relay 26 to close when the power conversion device 12 is powered on thereby enabling the power conversion device 22 to operate in its normal operating mode (e.g., convert power, perform isolation monitor, etc.)

In operation 56, after the relay 26 is closed, hi-pot testing is not allowed since the lower rated electronics (e.g., the plurality of resistors R1, R2, R3, and R4 and the plurality of switches S1, S2, S3, and S4) are operating to perform the desired operations of the power conversion device 12.

In operation 58, the relay 26 is open when the vehicle system 11 is not powered. In this case, the relay 26 may be implemented as a normally-open relay such that when power is not applied by the power source 14, the relay 26 is in an open state thereby prevent current flow to the lower rated electronics (e.g., the plurality of resistors R1, R2, R3, and R4 and the plurality of switches S1, S2, S3, and S4).

In operation 60, the power conversion device 12 is ready to undergo hi-pot testing as the high voltage associated with such testing is preventing from being transferred to the lower rated electronics since the relay 26 is in the open state.

Figure 3:
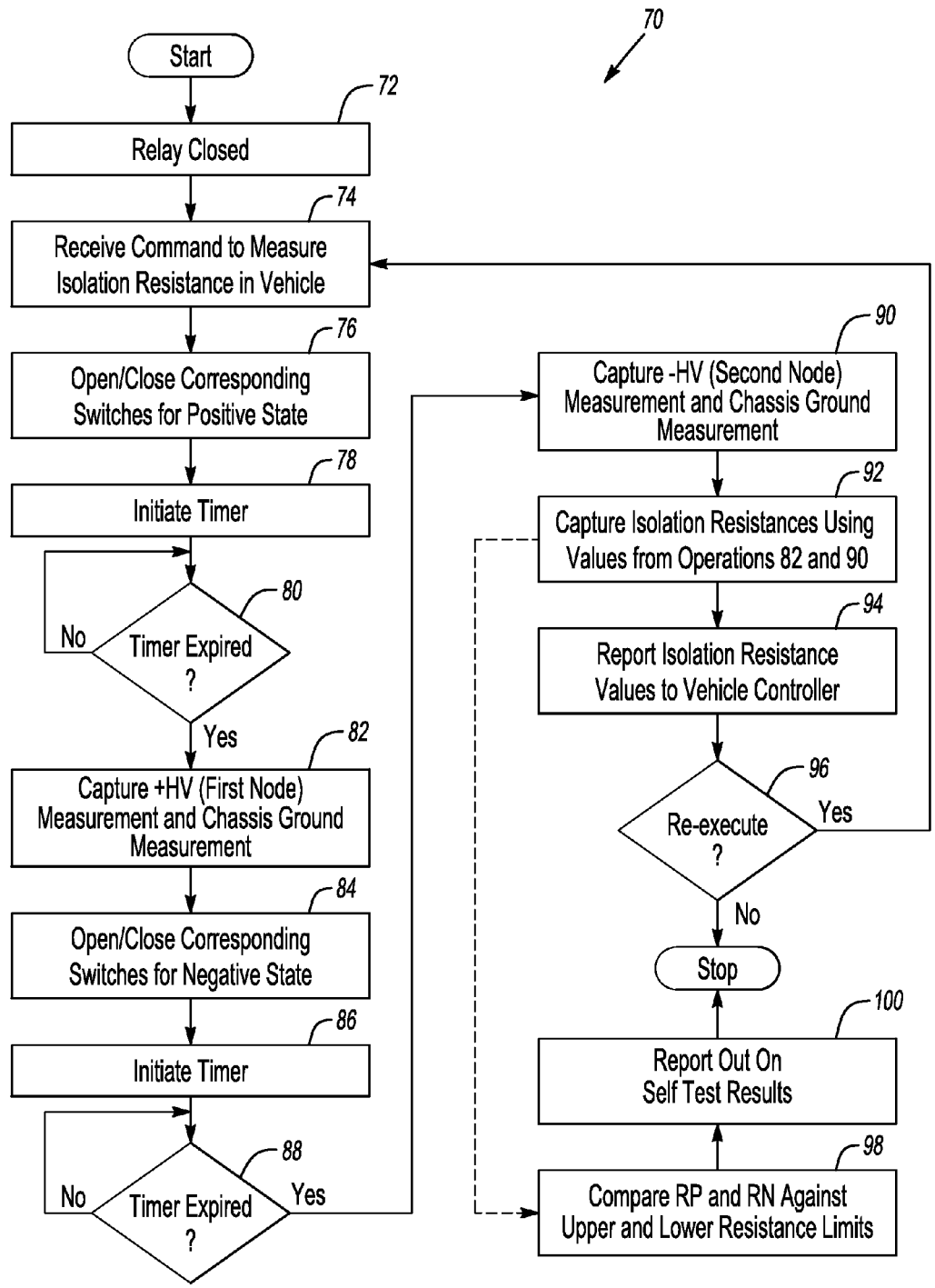
FIG. 3 depicts a method for performing the high voltage isolation monitor in accordance to one embodiment of the present invention.

FIG. 3 depicts a method 70 for measuring the impedance (e.g., Rp and Rn) of the vehicle system 11 in accordance to one embodiment of the present invention. It is recognized that operations of the method 50 may be performed while the power conversion device 12 is operating in a normal operating mode.

In operation 72, the power conversion device 12 is powered on and the relay 26 is closed thereby enabling the power conversion device 12 to operate in a normal operating mode (e.g., converts power in the vehicle system 11 for some purpose).

In operation 74, the power conversion device 12 receives a command over a communication data bus (e.g., controller area network (CAN), local interconnect network (LIN), or other suitable data communication link) to measure the impedance in the vehicle system 11.

In operation 76, the power conversion device 12 measures a positive state of the system 11. In this positive state, the power conversion device 12 enables current to flow through a resistor (e.g., R3) whose value is known (or predetermined) between +HV node of the high voltage bus 16 and the chassis ground 18. For example, the controller 24 controls the switch S3 to close enabling the resistor R3 to receive voltage from the power source 14.

In operation 78, the power conversion device 12 (or the controller 24) initiates a timer when the switch S3 is closed to provide a delay. The delay allows Y-capacitance in the vehicle system 11 to be charged. In general, a small capacitance is placed between the chassis ground 18 and other nodes to improve system noise immunity and improve electromagnetic emissions. Typically, these capacitors are placed between HV+ of the high voltage bus 16 and the chassis ground 18 and HV− of the high voltage bus 16 and the chassis ground 18, thus forming a "Y" shaped structure.

In operation 80, the controller 24 determines if the timer has expired or not. If so, then the method 70 moves to operation 82. If not, then the method 70 remains in operation 80.

In operation 82, the controller 24 measures voltage from +HV on the high voltage bus 16 to the chassis ground 18 (e.g., measures voltage across points A and B (see FIG. 1)) while switch S3 is closed and resistor R3 is active in the vehicle system 11. This measured voltage is defined as HV_DC_P. The controller 24 also measures voltage from the chassis ground 18 to −HV of the high voltage bus 16 (e.g., measures voltage across points B and C)) while switch S3 is closed and resistor R3 is active in the vehicle system 11. This measured voltage is defined as ISO_MEAS_P.

The controller 24 then calculates VM1 which is a ratio of the chassis ground voltage (e.g., ISO_MEAS_P) over the positive high voltage when resistor R3 activated (e.g., HV_DC_P), or VM1=ISO_MEAS_P/HV_DC_P.

In operation 84, the power conversion device 12 measures a negative state of the system 11. In this negative state, the power conversion device 12 enables current to flow through resistor (e.g., S1) whose value is known (or predetermined) between −HV node of the high voltage bus 16 and the chassis ground 18. For example, the controller 24 controls the switch S1 to close enabling the resistor R1 to receive voltage from the power source 14.

In operation 86, the power conversion device 12 (or the controller 24) initiates a timer when the switch S1 is closed to provide a delay. The delay allows Y-capacitance in the vehicle system 11 to be charged.

In operation 88, the controller 24 determines if the timer has expired or not. If so, then the method 70 moves to operation 90. If not, then the method 70 remains in operation 88.

In operation 90, the controller 24 measures voltage from +HV on the high voltage bus 16 to the chassis ground 18 (e.g., measures voltage across points A and B (see FIG. 1)) while switch S1 is closed and resistor R1 is active in the vehicle system 11. This measured voltage is defined as HV_DC_N. The controller 24 also measures voltage from the chassis ground 18 to −HV of the high voltage bus 16 (e.g., measures voltage across points B and C)) while switch S1 is closed and resistor R1 is active in the vehicle system 11. The measured voltage is defined as ISO_MEAS_N.

The controller 24 then calculates VM1 which is a ratio of the chassis ground voltage (e.g., ISO_MEAS_N) over the high voltage when resistor R1 activated (e.g., HV_DC_N), or VM2=ISO_MEAS_N/HV_DC_N.

In operation 92, the controller 24 determines the isolation resistance RP and RN by the following equations:

$$RP=(Rt*(VM1-VM2)/VM2)), \text{ and}$$

$$RN=(Rt*(VM2-VM1)/(VM1-1),$$

where Rt is defined as a test resistance that may be set to, for example, 300K Ohms.

In operation 94, the controller 24 transmits the values calculated for RP and RN to a vehicle controller (not shown) over the data communication bus.

In operation 96, the power conversion device 12 may re-execute the operations noted above while in a normal operating mode. It is recognized that the operations noted above may be performed while the vehicle is in a normal operating mode. For example, the power conversion device 12 may continuously (or periodically) perform the aforementioned operations while the vehicle is running to ensure that RP and RN are within an acceptable sufficient safety isolation range while the power conversion device 12 receives the high DC voltage. A low impedance measurement at RP or RN may be indicative of a fault (or failure) in the vehicle system 11 in which it may be necessary to stop receiving the high DC energy. When either RP or RN is measured to be below a threshold, the system 10 may elect to cut off the HV energy supply due to reduced isolation.

If the RP or RN is determined to be low, the vehicle controller may shut the vehicle down to prevent the power source 14 from providing the high voltage. Alternatively, the power conversion device 12 may shut itself down to prevent the high voltage from being delivered in moments in which RP or RN is determined to be low.

It is further recognized that the method 70 may be used to support a self-test function for the power conversion device 12. The self-test function is performed to ensure that the power conversion device 12 is determining RP and RN properly. The operations noted above in connection with the method 70 are executed again with a slight modification to operations 76, 82, 84, and 90 when the power conversion device 12 performs the self-test function. Further, operation 94 is not executed and new operations 98 and 100 will be executed. Operations 76, 82, 84 and 90 will are restated directly below in connection with the self-test function. Further, new operations 98 and 100 are set forth directly below in connection with the self-test function.

In operation 76, the power conversion device 12 measures the positive state of the system 11 while performing the self-test. In this positive state, the power conversion device 12 enables current to flow through resistors (e.g., R2, R3, and R4) whose values are known (or predetermined) between +HV node of the high voltage bus 16 and the chassis ground 18. For example, the controller 24 controls the switches S2, S3, and S4 to close enabling the resistors R2, R3 and R4 to receive voltage from the power source 14.

Similarly, as noted in above in connection, the timer operations 78 and 80 are performed.

In operation 82, the controller 24 measures voltage from +HV on the high voltage bus 16 to the chassis ground 18 (e.g., measures voltage across points A and B (see FIG. 1)) while switches S2, S3 and S4 are closed and resistors R2, R3 and R4 are active in the vehicle system 11. This measured voltage is defined as HV_DC_P. The controller 24 also measures voltage from the chassis ground 18 to −HV of the high voltage bus 16 (e.g., measures voltage across points B and C)) while switches S2, S3, and S4 are closed and resistors R2, R3, and R4 are active in the vehicle system 11. This measured voltage is defined as ISO_MEAS_P.

The controller 24 then calculates VM1 which is a ratio of the chassis ground voltage (e.g., ISO_MEAS_P) over the positive high voltage when resistors R3 and R4 are activated (e.g., HV_DC_P), or VM1=ISO_MEAS_P/HV_DC_P.

In operation 84, the power conversion device 12 measures the negative state of the system 11. In the negative state, the power conversion device 12 enables current to flow through resistors (e.g., R1, R2, R4) whose values are known (or predetermined) between −HV node of the high voltage bus 16 and the chassis ground 18. For example, the controller 24 controls the switches S1, S2, and S4 to close enabling the resistors R1, R2, and R4 to receive voltage from the power source 14.

Similarly, as noted in above in connection, the timer operations 86 and 88 are performed.

In operation 90, the controller 24 measures voltage from +HV on the high voltage bus 16 to the chassis ground 18 (e.g., measures voltage across points A and B (see FIG. 1)) while switches S1, S2, and S4 are closed and resistors R1, R2, and R4 are active in the vehicle system 11. This measured voltage is defined as HV_DC_N. The controller 24 also measures voltage from the chassis ground 18 to −HV of the high voltage bus 16 (e.g., measures voltage across points B and C)) while switches S1, S2, and S4 are closed and resistors R1, R2, and R4 are active in the vehicle system 11. The measured voltage is defined as ISO_MEAS_N.

The controller 24 then calculates VM1 which is a ratio of the chassis ground voltage (e.g., ISO_MEAS_N) over the positive high voltage when R1 activated (e.g., HV_DC_N), or VM2=ISO_MEAS_N/HV_DC_N.

In operation 92, the controller 24 determines the isolation resistance RP and RN by the following equations:

$$RP=(Rt*(VM1-VM2)/VM2)), \text{ and}$$

$$RN=(Rt*(VM2-VM1)/(VM1-1),$$

where Rt is defined as a test resistance that may be set to, for example, 300K Ohms.

In operation 98, the controller 24 compares RP or RN against an upper limit resistance value and a lower limit resistance value. RP may not be required to be equal to RN. In any case, the upper and lower limits can be set for RP and RN. If RP or RN is less than the lower limit resistance value or greater than the upper limit resistance value, then the self-test indicates that the isolation monitor while performed during the normal operating mode is not adequate due to a failure in the power conversion device 12.

If RP or RN is within the upper limit resistance value and the lower limit resistance value, then the self-test indicates that the isolation monitor while performed during the normal operating mode is adequate.

In operation 100, the power conversion device 12 reports out the status of the self-test (e.g., pass or fail) to the vehicle controller or to a diagnostic tool.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An apparatus for monitoring a high voltage isolation in a vehicle, the apparatus comprising: a power conversion device for receiving a high voltage on a power bus, the power bus including a first node and a second node, the power conversion device being configured to: control a first switch to close to enable a first known resistance to receive the high voltage; initiate a timer in response to controlling the first switch to close; measure a first voltage between the first node and a ground in response to the first known resistance receiving the high voltage after the timer has expired; measure a second voltage between the second node and the ground in response to the first known resistance receiving the high voltage after the timer has expired; and determine a first leakage resistance between the first node and the ground based on at least the first voltage and the second voltage, the first leakage resistance being indicative of whether the high voltage is isolated from the ground, wherein the power conversion device includes a relay to enable the high voltage to pass through the first switch when the power conversion device is in a normal operating mode and to prevent a voltage to pass through the first switch when the power conversion device is exposed to a hi-pot test, wherein the power conversion device is powered off when the hi-pot test is executed and the relay prevents the voltage from passing through the first switch when the hi-pot test is executed, and wherein the hi-pot test corresponds to electrically-over stressing the power conversion device.

2. The apparatus of claim 1 wherein the power conversion device is further configured to control a second switch for enabling a second known resistance to receive the high voltage and to measure a third voltage between the first node and the ground in response to the second known resistance receiving the high voltage.

3. The apparatus of claim 2 wherein the power conversion device is further configured to measure a fourth voltage between the second node and the ground in response to the second known resistance receiving the high voltage.

4. The apparatus of claim 3 wherein the power conversion device is further configured to determine a second leakage resistance between the second node and the ground based on at least the third voltage and the fourth voltage, the second leakage resistance also being indicative of whether the high voltage is isolated from the ground.

5. The apparatus of claim 1 wherein the first node of the power bus comprises a positive high voltage node.

6. The apparatus of claim 1 wherein the second node of the power bus comprises a negative high voltage node.

7. The apparatus of claim 1 wherein the ground is a chassis ground positioned in the vehicle.

8. A method for monitoring a high voltage isolation in a vehicle, the method comprising: receiving, at a power conversion device, a high voltage on a power bus, the power bus including a first node and a second node; controlling a first switch to close to enable a first known resistance to receive the high voltage; initiating a timer in response to controlling the first switch to close; measuring a first voltage between the first node and a ground in response to the first known resistance receiving the high voltage after the timer has expired; a second voltage between the second node and the ground in response to the first known resistance receiving the high voltage after the timer has expired; and determining a first leakage resistance between the first node and the ground based on at least the first voltage and the second voltage, the first leakage resistance being indicative of whether the high voltage is isolated from the ground; enabling, with a relay, the high voltage to pass through the first switch in a normal operating mode; powering off the power conversion device when a hi-pot test is executed; preventing, with the relay, a voltage from passing through the first switch when the power conversion device is being exposed to the hi-pot test; and wherein the hi-pot test corresponds to electrically-over stressing the power conversion device.

9. The method of claim 8 further comprising controlling a second switch for enabling a second known resistance to receive the high voltage and measuring a third voltage between the first node and the ground in response to the second known resistance receiving the high voltage.

10. The method of claim 9 further comprising measuring a fourth voltage between the second node and the ground in response to the second known resistance receiving the high voltage.

11. The method of claim 10 further comprising determining a second leakage resistance between the second node and the ground based on at least the third voltage and the fourth voltage, the second leakage resistance also being indicative of whether the high voltage is isolated from the ground.

12. The method of claim 8 wherein the first node of the power bus comprises a positive high voltage node.

13. The method of claim 8 wherein the second node of the power bus comprises a negative high voltage node.

14. The method of claim 8 wherein the ground is a chassis ground positioned in the vehicle.

15. An apparatus for monitoring a high voltage isolation in a vehicle, the apparatus comprising: a power conversion device for receiving a high voltage on a power bus, the power bus including a positive node and a negative node, the power conversion device being configured to: control a first switch to close to enable a first known resistance to receive the high voltage; initiate a timer in response to controlling the first switch to close; determine a first voltage between the positive node and a ground in response to the first known resistance receiving the high voltage after the timer has expired; determine a second voltage between the negative node and the ground in response to the first known resistance receiving the high voltage after the timer has expired; and determine a first leakage resistance between the positive node and the ground based on at least the first voltage and the second voltage, the first leakage resistance being indicative of whether the high voltage is isolated from the ground, wherein the power conversion device includes a relay to enable the high voltage to pass through the first switch when the vehicle is running and to prevent a voltage from passing through the first switch when the power conversion device is exposed to a hi-pot test, wherein the power conversion device is powered off when the hi-pot test is executed and the relay prevents the voltage from passing through the first switch when the hi-pot test is executed; and wherein the hi-pot test corresponds to electrically-over stressing the power conversion device.

\* \* \* \* \*